US010910827B2

(12) United States Patent
Valdivia Guerrero et al.

(10) Patent No.: US 10,910,827 B2
(45) Date of Patent: Feb. 2, 2021

(54) INRUSH CURRENT LIMITING SYSTEM AND METHOD

(71) Applicant: Hamilton Sundstrand Corporation, Charlotte, NC (US)

(72) Inventors: Virgilio Valdivia Guerrero, Roquetas de Mar (ES); Fabien Dubois, Glanmire (IE); Laura Albiol-Tendillo, Tarrogona (ES); Mustansir Kheraluwala, Lake Zurich, IL (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 394 days.

(21) Appl. No.: 15/915,151

(22) Filed: Mar. 8, 2018

(65) Prior Publication Data
US 2018/0323608 A1 Nov. 8, 2018

(30) Foreign Application Priority Data

May 8, 2017 (EP) .................................... 17169985

(51) Int. Cl.
*H02H 9/00* (2006.01)
*G05F 1/66* (2006.01)
*H02H 9/02* (2006.01)
*H02H 1/00* (2006.01)
*H03K 17/082* (2006.01)
*H03K 17/16* (2006.01)

(52) U.S. Cl.
CPC .............. *H02H 9/002* (2013.01); *G05F 1/66* (2013.01); *H02H 1/0092* (2013.01); *H02H 9/02* (2013.01); *H03K 17/0822* (2013.01); *H03K 17/166* (2013.01); *H03K 2217/0027* (2013.01); *H03K 2217/0063* (2013.01)

(58) Field of Classification Search
CPC .................................. H02H 9/002; G05F 1/66
See application file for complete search history.

(56) References Cited

U.S. PATENT DOCUMENTS

| 4,740,883 A | 4/1988 | McCollum |
| 5,496,989 A | 3/1996 | Bradford et al. |
| 8,299,767 B1 | 10/2012 | Tuozzolo et al. |

(Continued)

FOREIGN PATENT DOCUMENTS

WO 2015097394 A1 7/2015

OTHER PUBLICATIONS

Extended European Search Report for International Application No. 17169985.3 dated Nov. 11, 2017, 7 pages.

(Continued)

*Primary Examiner* — Scott Bauer
(74) *Attorney, Agent, or Firm* — Cantor Colburn LLP

(57) ABSTRACT

A solid state power controller, SSPC, having an input to receive supply current and an output for providing output current to a load in response to connection to the power supply, the solid state power controller further comprising at least one solid state switch and a controller to limit the power dissipated in the solid state power switch based on a measured voltage across the solid state switch and a predetermined power dissipation threshold for the SSPC to adjust the output current or voltage control signal of the solid state switch such that the actual power dissipation of the SSPC does not exceed the threshold.

8 Claims, 6 Drawing Sheets

(56) References Cited

U.S. PATENT DOCUMENTS

| | | | |
|---|---|---|---|
| 8,816,625 B2 | 8/2014 | Kopiness et al. | |
| 2002/0015272 A1 | 2/2002 | Hattori | |
| 2006/0164769 A1* | 7/2006 | Stanford | H04L 49/351 |
| | | | 361/87 |
| 2011/0221404 A1 | 9/2011 | Rozman et al. | |
| 2011/0309809 A1 | 12/2011 | Rao et al. | |
| 2012/0182656 A1 | 7/2012 | Kheraluwala et al. | |
| 2013/0050880 A1 | 2/2013 | Rozman et al. | |
| 2013/0050890 A1 | 2/2013 | Rozman et al. | |
| 2013/0300326 A1 | 11/2013 | Lan | |
| 2014/0084856 A1* | 3/2014 | Howard | H02J 5/005 |
| | | | 320/108 |
| 2015/0035498 A1 | 2/2015 | Izquierdo et al. | |
| 2016/0204777 A1* | 7/2016 | Greither | H03K 17/122 |
| | | | 327/404 |

OTHER PUBLICATIONS

Izquierdo, D., R. Azcona, F. J. L. d. Cerro, C. Fernandez, and J. Insenser, "Electrical Power Distribution Architecture for All Electric Aircraft," in 27th International Congress of the Aeronautical Science ICAS, 2010, 9 Pages.

Liu, et al., "SSPC Technologies for Aircraft High Voltage DC Power Distribution Applications," in SAE Power Systems Conference Oct. 22, 2012; 11 pages.

Terorde, et al., "Implementation of a Solid-State Power Controller for High-Voltage DC Grids in Aircraft," in IEEE Power and Energy Student Summit, TU Dortmund University, Jan. 2015. 6 pages.

\* cited by examiner

INRUSH CURRENT LIMITING SYSTEM AND METHOD

FOREIGN PRIORITY

This application claims priority to European Patent Application No. 17169985.3 filed May 8, 2017, the entire contents of which is incorporated herein by reference.

TECHNICAL FIELD

The present disclosure relates to limiting inrush current in power drive systems.

BACKGROUND

Many fields of technology require the provision of drive power, from one or more power sources, to one or more loads. Often power has to be converted before being provided to the load(s) and/or has to be distributed between loads. Power distribution systems are used, for example, in aircraft and other vehicles to distribute electrical power from the power source(s), such as a generator (on the engine) or a battery, to different electronic systems having, often, different power requirements. A known problem is that when a load is switched on, particularly in the case of high capacitive loads, a current surge, or inrush current, can result which can cause damage to components and failure of the system. In aircraft applications, for example, inrush current should be limited to reduce the risk of a bus voltage drop, which could cause system fault when such loads are connected to a battery, HVDC (high voltage direct current) bus or LVDC (low voltage direct current) bus. It also needs to be limited to avoid electromagnetic interference issues due to high level of emissions and finally to reduce the risk of cable degradation. In non-private electrical buses, typical aircraft power system requirements related to inrush currents must be accomplished in the terminals of the load (or, within the load), generally using a pre-charge resistor (to limit inrush current) in parallel to an electro-mechanical relay or a solid-state switch (e.g. thyristor). This technique increases physical volume, weight and cost of the load(s), and hence to the overall system, and impacts reliability e.g. see U.S. Pat. No. 8,816,625 and US2013/0300326.

More recently, Solid State Power Controllers (SSPCs) have been used in power distribution systems, particularly in aircraft technology where there is a move towards 'more electric aircraft' (MEA), see e.g. D. Izquierdo, R. Azcona, F. J. L. d. Cerro, C. Fernández, and J. Insenser, "Electrical Power Distribution Architecture for All Electric Aircraft," in 27*th International Congress of the Aeronautical Science ICAS,* 2010; Z. Liu, R. Fuller, and W. Pearson, "SSPC Technologies for Aircraft High Voltage DC Power Distribution Applications," in *SAE Power Systems Conference* 2012; and M. Terode, F. Grumm, D. Schulz, H. Wattar, and J. Lemke, "Implementation of a Solid-State Power Controller for High-Voltage DC Grids in Aircraft," in *IEEE Power and Energy Student Summit,* TU Dortmund University, 2015. SSPCs allow integration of more functionalities such as current limiting, bus diagnostics, fault detection, and others compared to conventional electromechanical relays. Also it is worth mentioning that SSPCs are more robust than electromechanical relays (i.e. arcing) and are faster to shut down. In private electrical buses the inrush current limiting does not have to be accomplished necessarily in the load. Therefore, there is the opportunity for SSPCs to control the inrush current instead of using additional components within the load.

Some prior solutions with SSPCs have been considered, including incorporating pre-charge circuitry in the SSPC (as shown in FIG. 1b discussed below). Examples of such systems are taught for example in US2013/0050890, US2013/0050880, US2011/0309809, US2011/0221404, US2015/0035498 and WO2015097394.

Solutions limiting the inrush current by active means are found in US2011/0221404, US2012/0182656, WO2015/097394 US20150035498A1. WO2015/097394, for example, uses active temperature control using a thermal model of the switch. This can be very effective and prevent overheating, but is very complex.

There is, therefore, a need for an intelligent way to limit inrush current in SSPC-controlled power systems on connection of a load system e.g. a motor drive, to a low or high voltage DC bus.

SUMMARY

The disclosure provides a solid state power controller, SSPC, that connects one or more sources to one or more loads. The SSPC consists of at least one solid state switch. The SSPC limits the inrush current by operating the solid state switch or switches in linear mode through control of its equivalent resistance and limits the power dissipated in the switch by control means based on a predetermined power dissipation threshold.

Accordingly, in one aspect, the disclosure provides a solid state power controller having an input to receive supply current and an output for providing output current to a load in response to its connection to the power supply, the solid state power controller further comprising at least one solid state switch and a controller to regulate the current flowing through the solid state switch(es) based on a current control reference signal; and characterised in that the solid state power controller further comprises a controller that regulates the power dissipated in the solid state power switch based on a measured voltage across the solid state switch and a selected power dissipation threshold for the SSPC to adjust the output current such that the actual power dissipation of the SSPC does not exceed the threshold.

In another aspect, the disclosure provides a method of providing output current to a load from a solid state power controller, SSPC, comprising regulating power dissipated in a solid state power switch of the SSPC based on a measured voltage across the solid state switch and a selected power dissipation threshold for the SSPC to adjust the output current such that the actual power dissipation of the SSPC does not exceed the threshold.

BRIEF DESCRIPTION

Preferred embodiments will now be described, by way of example only, with reference to the drawings.

DETAILED DESCRIPTION

The present system avoids the need for additional pre-charge circuitry in an electronic load such as a motor drive system by actively controlling current supplied to the load (e.g. motor drive) based on power dissipation of the SSPC.

Figure 1A:
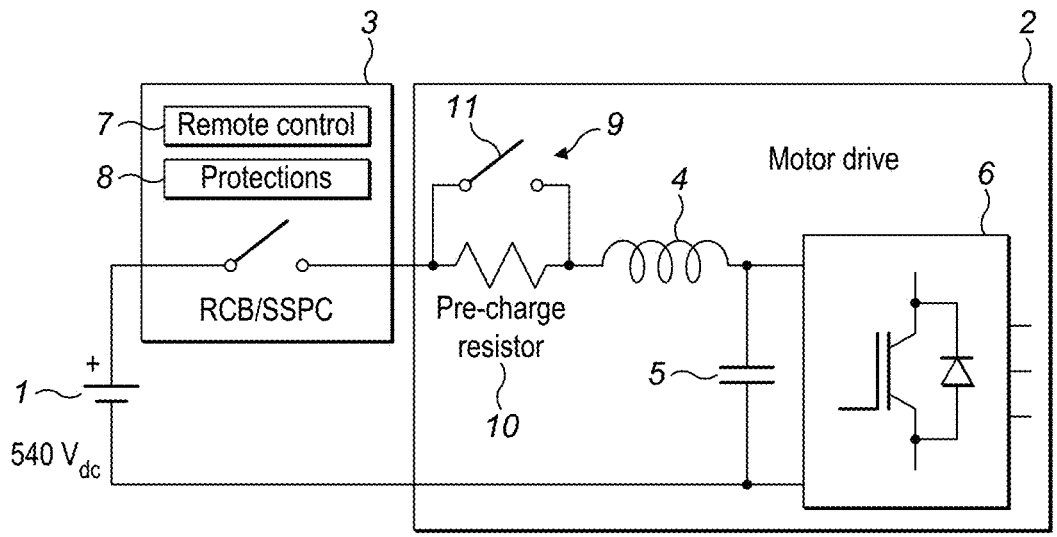
FIG. 1a is a block diagram of a known power distribution system consisting of a DC source connected to a load (e.g. motor drive) through an SSPC.
Figure 1B:
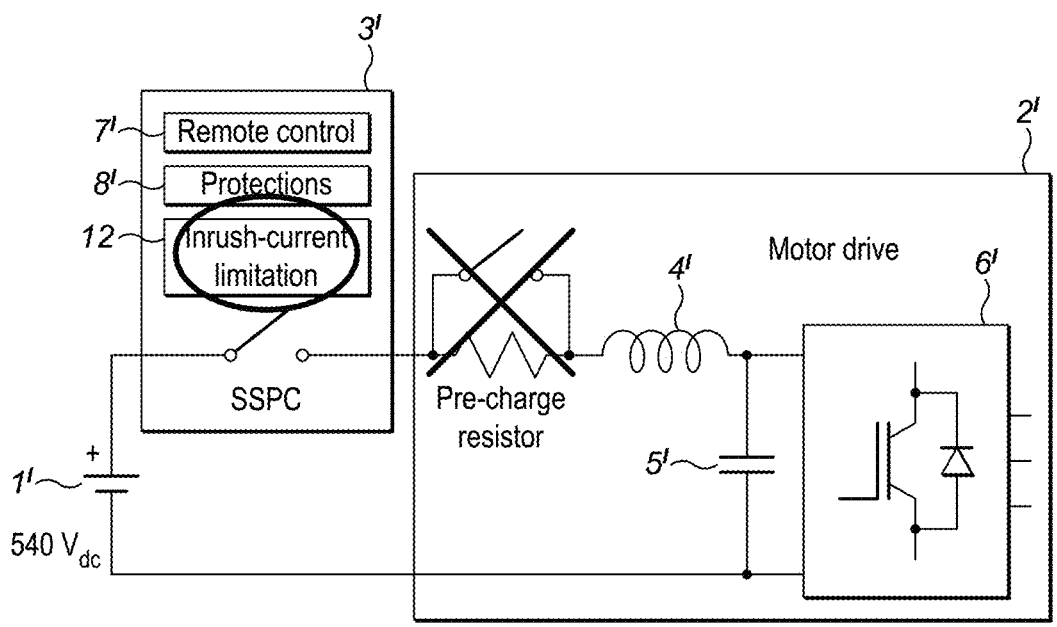
FIG. 1b is a block diagram of a power distribution system incorporating the disclosed solution.

FIGS. 1a and 1b are block diagrams that contrast an existing solution to the problem of inrush current in SSPC-sourced motor drive systems (FIG. 1a) with the solution proposed by the present disclosure (FIG. 1b).

The power distribution system includes a power source 1,1' (here a 540 Vdc supply, but other appropriate power sources may be used), connected to a load, here a motor drive 2,2', via an SSPC 3,3'. The motor drive preferably includes an input filter comprising an inductor 4,4' and a capacitor 5,5' and a switching bridge typically consisting of six or more semiconductor devices for a three-phase application (a single-phase application may have fewer semiconductor devices) 6,6' to output a drive current or voltage, among other components not included herein for the sake of simplicity. The SSPC 3,3' includes remote control circuitry 7,7' and protection circuitry 8,8'.

In the known system of FIG. 1a, the problem of inrush current is addressed by pre-charge circuitry 9 in the motor drive. Current flows through the pre-charge resistor 10 to gradually charge the capacitor 5. When the capacitor is charged to a given level, the switch 11 closes, short-circuiting the resistor 10. This avoids a sudden surge of current on the SSPC or solid-state relay switch-on.

As shown in FIG. 1b, in the present solution, inrush current limiting 12 is provided by the SSPC, as described further below, thus eliminating the need for the pre-charge circuit 9.

Figure 2A:
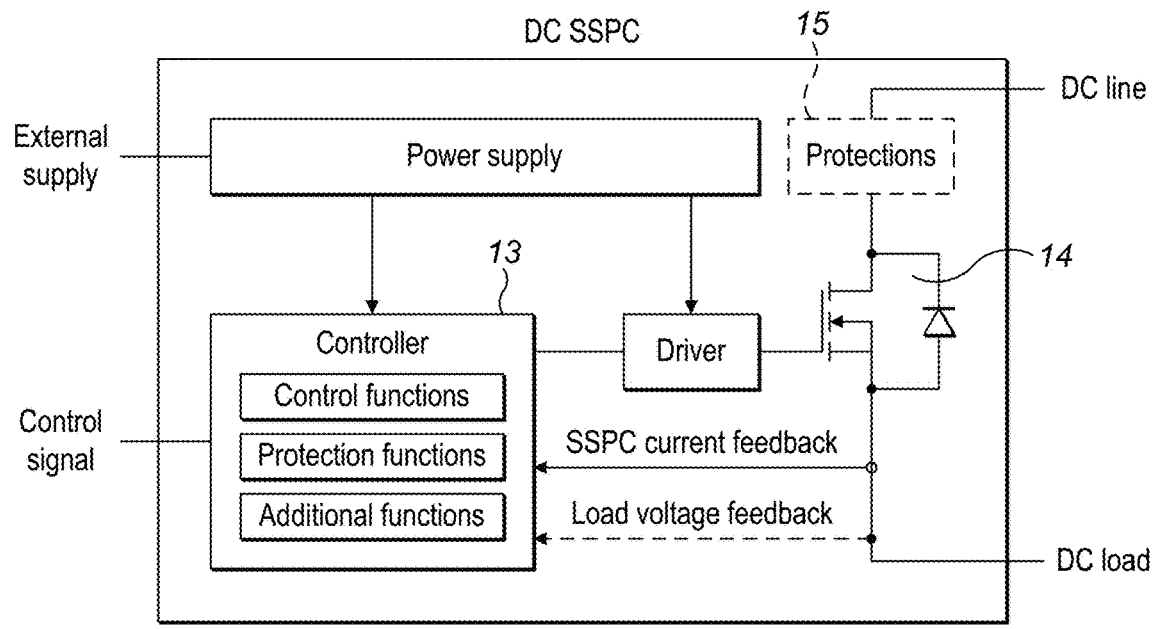
FIG. 2a is a simplified circuit diagram of a DC SSPC.
Figure 2B:
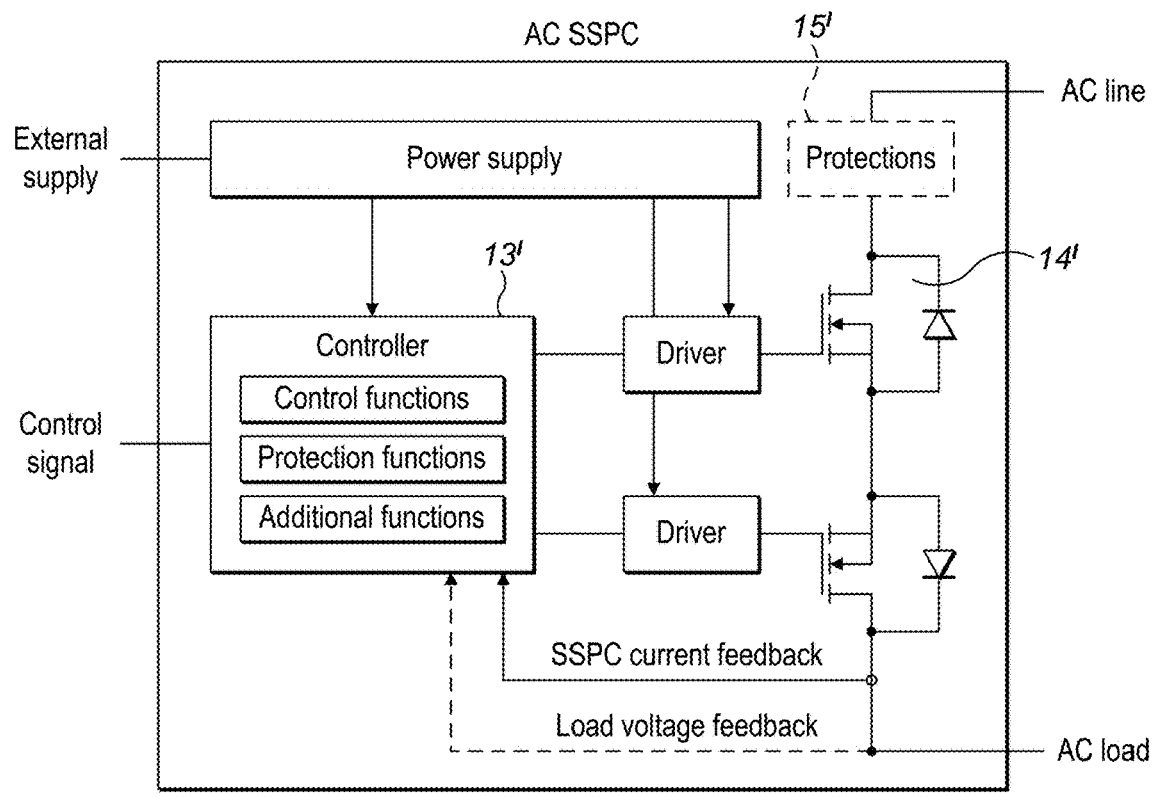
FIG. 2b is a simplified circuit diagram of an AC SSPC.

FIGS. 2a and 2b show, in more detail, the components of an SSPC such as in FIG. 1a. FIG. 2a shows a DC SSPC and FIG. 2b shows an AC SSPC. The controller 13,13' will include various functions including overcurrent protection function. Additional protection 15,15' may be provided between the solid state switch 14,14' and the DC or AC line, such as a fuse for e.g. to meet dissimilar protection capability requirements. SSPC output current to the load is fed back to the controller 13,13'. Load voltage can also be fed back to the controller 13, 13'.

The SSPC of the present system is modified to further include the inrush current limiting function (see FIG. 1b). This is illustrated in the block diagram of FIG. 3 and two more detailed examples are shown in FIGS. 4a and 4b.

Figure 3:
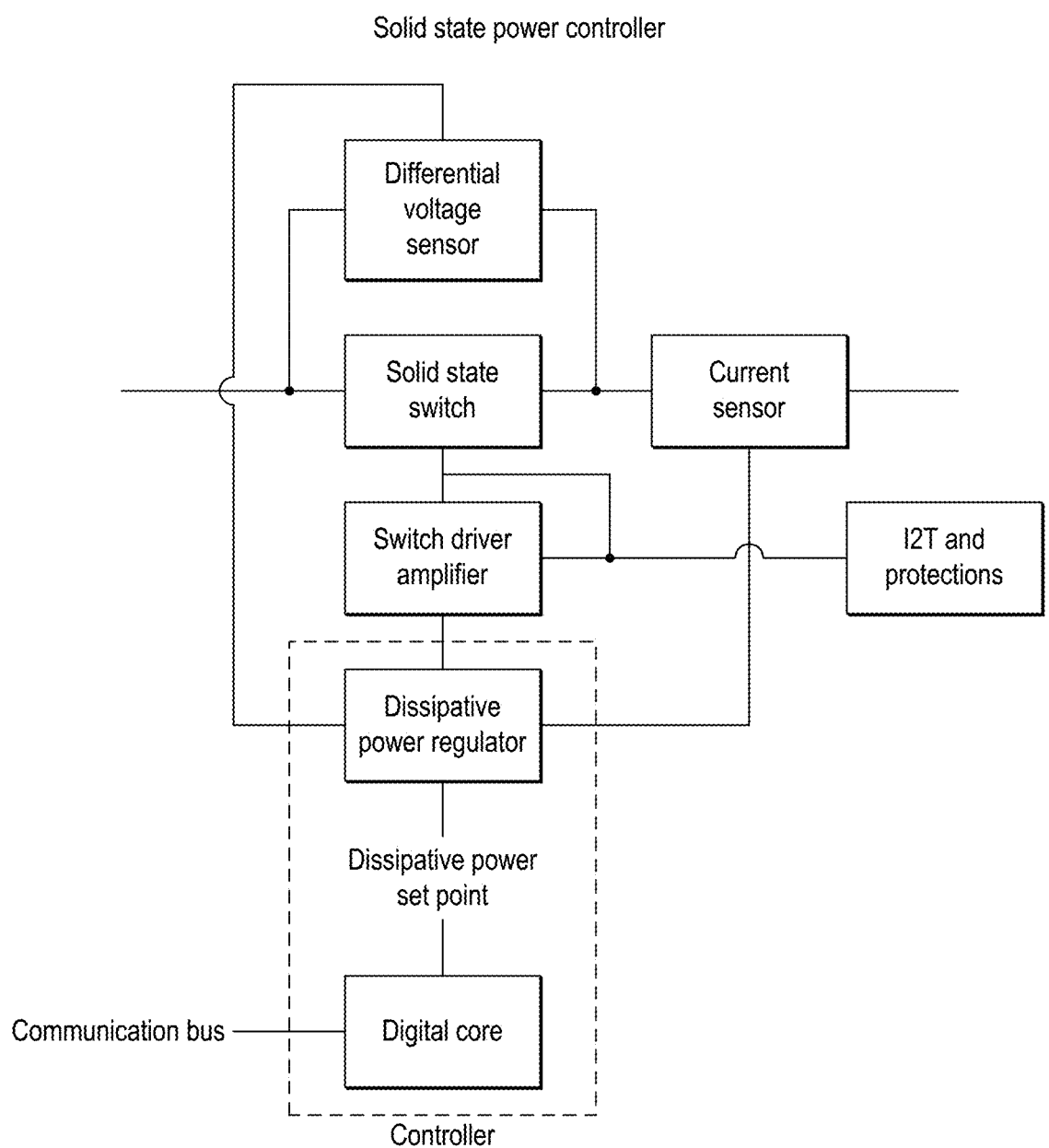
FIG. 3 is a block diagram of an SSPC incorporating the disclosed solution.
Figure 4A:
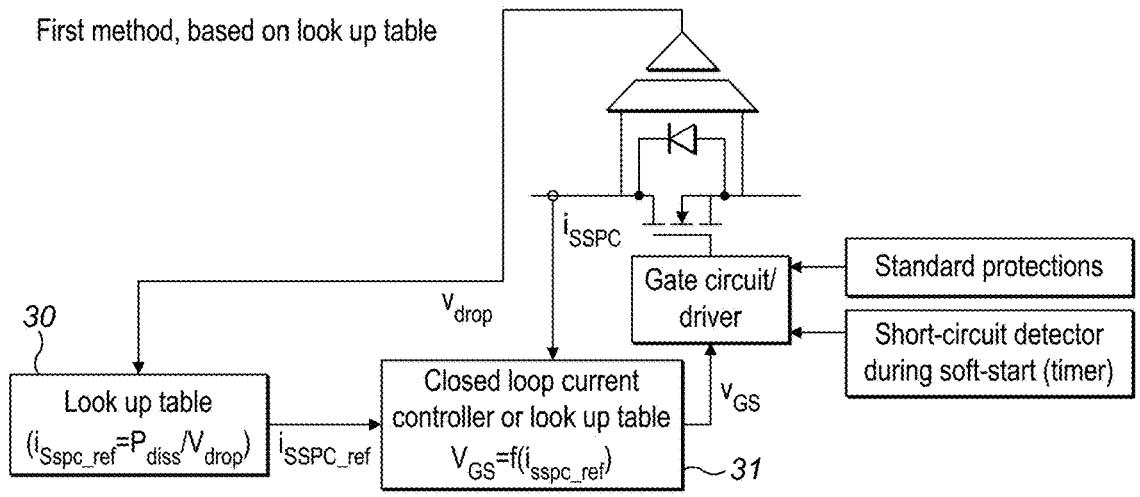
FIG. 4a shows one way of implementing the disclosed solution.
Figure 4B:
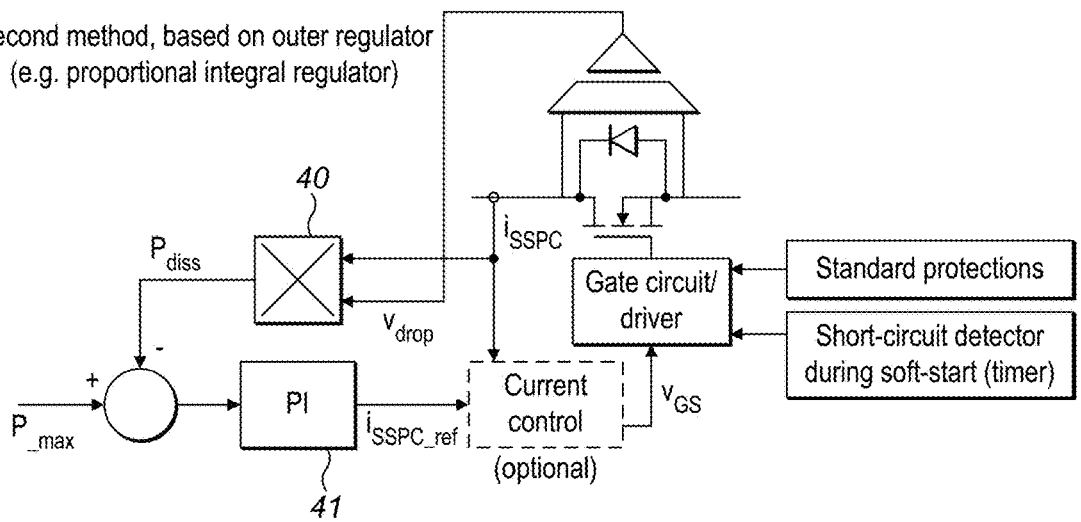
FIG. 4b shows an alternative way of implementing the disclosed solution.

Referring first to FIG. 3, the solid state switch 16, switch drive amplifier 17, current sensor 18 and protections 19 correspond to the standard SSPC components described and shown in relation to FIGS. 2a and 2b. In addition, the controller 21 includes a dissipative power regulator 20 and a differential voltage sensor.

The solid state switch 14,14',16 is shown in FIGS. 2a and 2b as a MOSFET but can be another type of solid state switch e.g. a Bipolar Junction Transistor BJT, an Insulated Gate Bipolar Transistor IGBT or a Junction Field Effect Transistor JFET. All solid state switches could be implemented in silicon, and some may include wide bandgap materials such as silicon carbide or gallium nitride.

The switch drive amplifier 17 provides an interface between the solid state switch 16 and the controller 21. The dissipative power regulator controls the current based on the power dissipated in the solid state switch 16. This can be implemented in various ways as described in more detail below.

The current sensor 18 can be based on a shunt measurement (i.e. resistor), Hall effect measurement or inductive measurement (current transformer, etc.) as known in the art.

As described above, the present solution lies in the active control of current being supplied to the load during pre-charge using the SSPC. A threshold power dissipation is defined for the SSPC, which is determined based on, for example, the thermal rise experienced by the solid-state switch (or switches). The thermal rise must be kept below a certain level to avoid damage to the SSPC and so the power dissipation threshold is selected to keep the thermal rise at or below that level (based e.g. on the solid-state switch materials, size, operating environment, etc.). By setting the power dissipation to a value that keeps the temperature of the solid-state switch (or switches) close to its maximum safe level, the pre-charge time can be minimised.

The current is controlled based on the power dissipation threshold. The set point for the current is determined based on an estimate of the instantaneous power dissipation of the solid-state switch, and the current is set so that the power dissipation does not exceed the threshold.

Most preferably, the instantaneous power dissipation is estimated based on the measured voltage drop across the SSPC (more specifically across the solid state switch). Using the voltage drop, the current can be controlled to not exceed the maximum power dissipation, which is the product of the measured voltage drop and the current to be controlled.

Figure 4C:
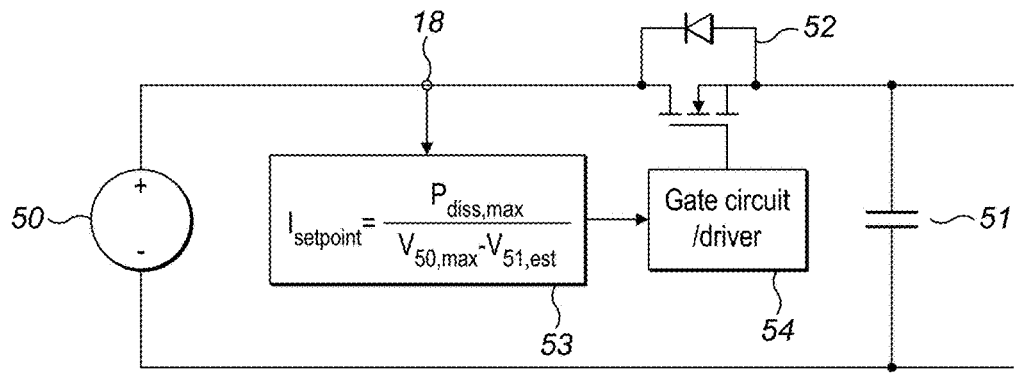
FIG. 4c shows an alternative way of implementing the disclosed solution.

FIGS. 4a, 4b and 4c illustrate three examples of how the power dissipation regulation can be implemented. Other ways may also be envisaged.

One embodiment, shown in FIG. 4a, uses a look-up table (LUT) 30. The look-up table associates measured voltage drop values ($v_{drop}$) with current values ($i_{sspc}$) for the target threshold power dissipation (Pass), based on the relationship i=Pdiss/v. For a given voltage drop, the look-up table gives a pre-computed reference current to achieve the desired power dissipation for that SSPC This current is achieved either using an inner current loop (which requires SSPC current feedback $i_{SSPC}$), or a second look-up-table which stores a pre-determined relation between control terminal voltage of the solid state switch and current $i_{SSPC}$, which does not require SSPC current feedback (31) This reference current is then compared, in the SSPC controller 21, FIG. 3, with the actual (measured) SSPC current to provide a control signal to the switch driver amplifier 17 (FIG. 3) which then accordingly controls the solid-state switch. This provides a simple arrangement.

An alternative power dissipation regulation is described with reference to FIG. 4b, which uses proportional-integral control as an example, other type of control could be implemented. This solution can be implemented using analog, digital or combined analog/digital means. Here, the instantaneous power dissipation is determined by a multiplier 40 based on the measured voltage drop and the measured current. The error between the instantaneous power dissipation and the desired maximum threshold dissipation is provided to a proportional-integral compensator 41, which outputs either the reference current to an inner loop, or the control terminal voltage to the solid state switch. As with the FIG. 4a embodiment, this reference current is then compared, in the SSPC controller 21, with the measured SSPC current to provide a control signal to the switch driver amplifier 17 (FIG. 3) which then accordingly controls the solid-state switch.

An alternative method is shown in FIG. 4c, where the SSPC 52 controls the inrush current and the power dissipated in the solid state switch using only the load current sensor 18. The voltage across the SSPC 52 is estimated based on the maximum source voltage 50 ($V_{50max}$) and the estimated voltage across the load capacitor 51 ($V_{51est}$). The current set point ($I_{setpoint}$) for the controller 53 is given by, $$I_{setpoint} = \frac{P_{diss}}{V_{50max} - V_{51est}}$$

The value of the capacitor 51 can be sent to the SSPC 52 by different means, e.g. through a communication bus, and the voltage across the capacitor $V_{51est}$ can be estimated based on the value of the capacitor and the measured current through the SSPC.

Alternative implementations may use, e.g., a digital controller.

The current can be controlled by an inner current control loop based on either an analog or a digital implementation, or the gate-source voltage can be directly commanded based on relationships determined in advance between the gate-source voltage and the drain current characteristics of the solid-state switch (e.g. MOSFET) without the need of the inner current controller. For example see means of controlling the SSPC in linear mode without current loop in US2012/0182656.

Figure 5:
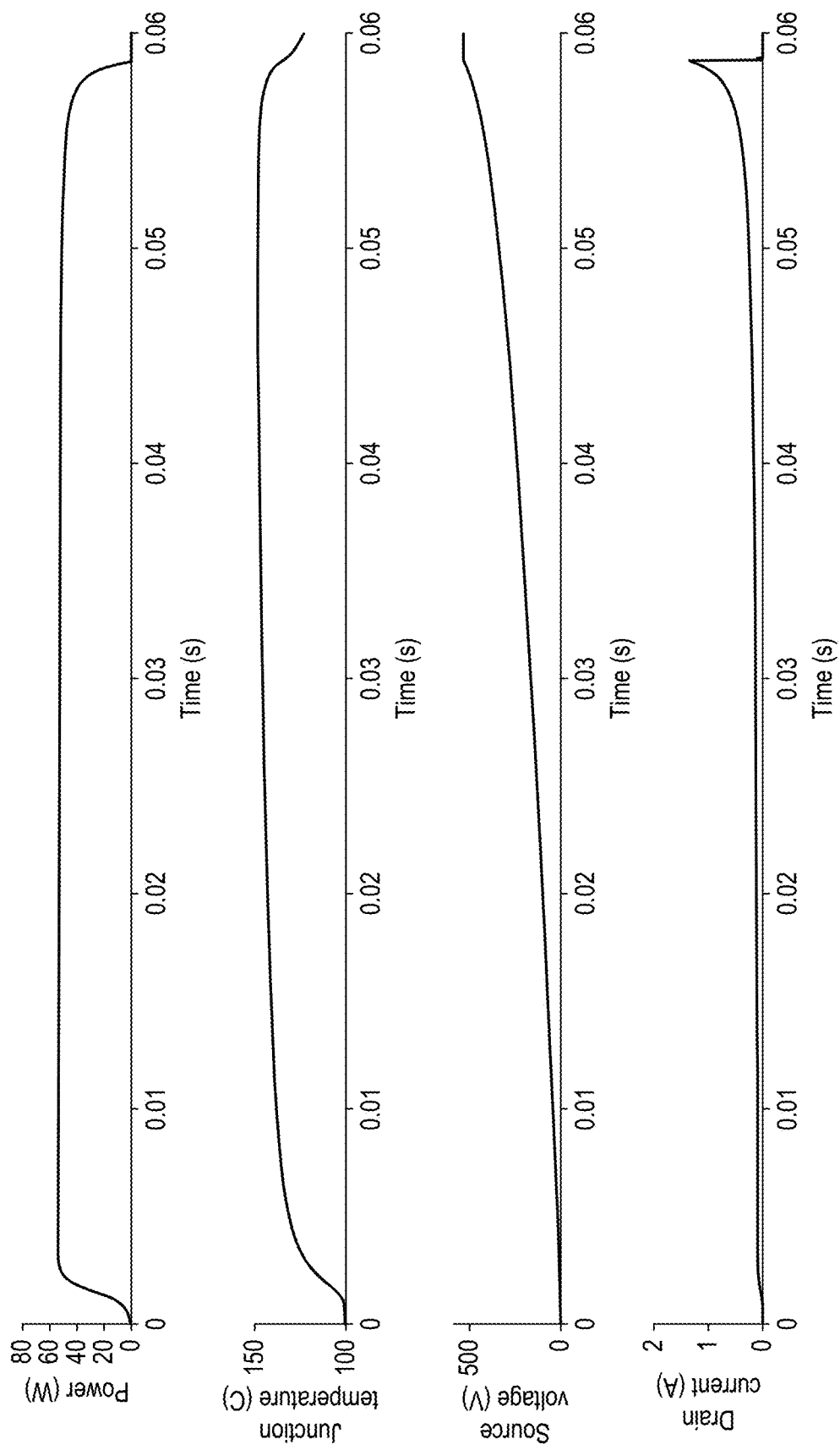
FIG. 5 shows simulation results of the disclosed solution.

The technique described in FIG. 4b has been simulated (refer to FIG. 5) demonstrating that the inrush current can be effectively limited and the input filter can be charged in a short time.

Figure 6:
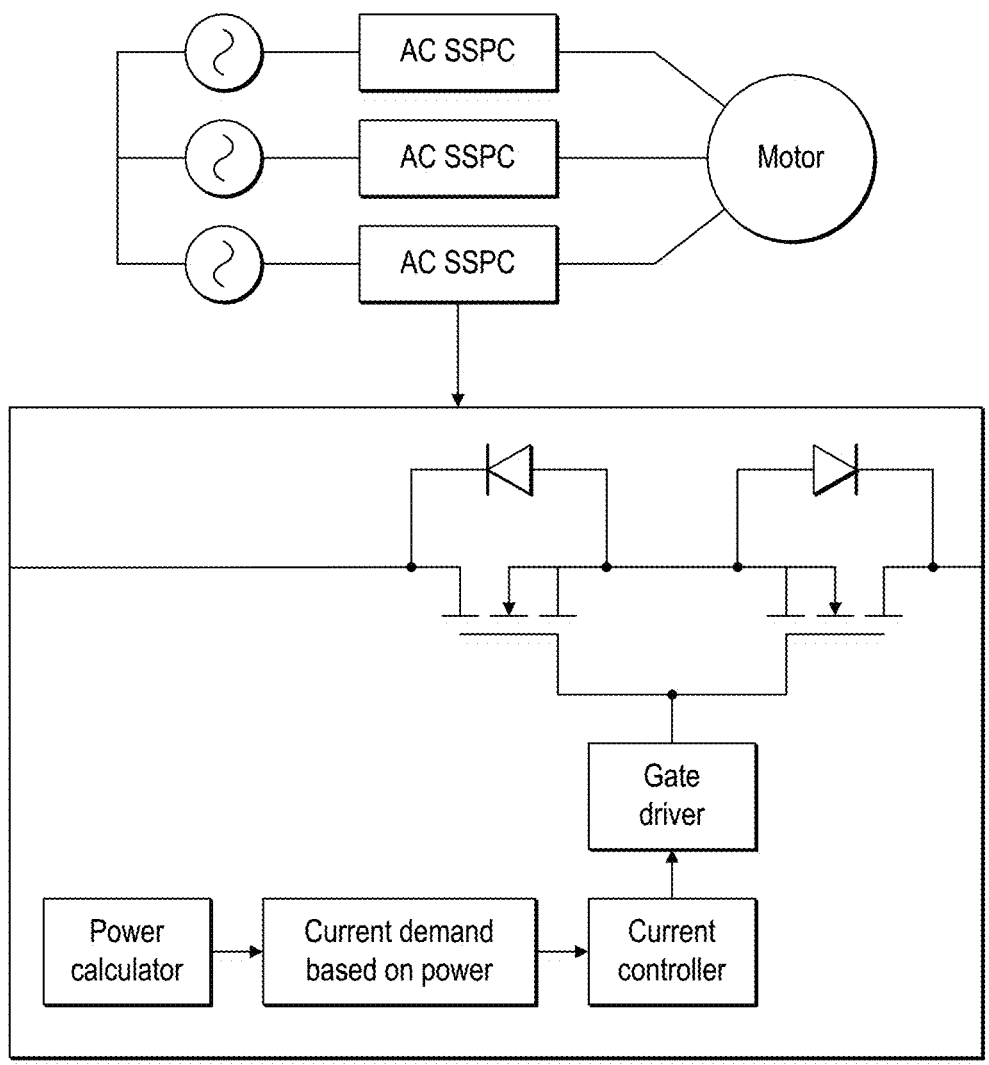
FIG. 6 shows an example of the solution in combination with an AC motor load.

The embodiments described above have been focused on 270V DC or 540V DC aircraft buses for concept illustration. However, the proposed technique to limit the inrush current using the SSPC solid-state switch in linear mode and regulating its power dissipation could be implemented in any application requiring charging of an energy storage element at start-up (capacitive, inductive, battery, etc.). Therefore, other applications could use the proposed invention, e.g. pre-charge of the transparency/hold-up capacitor connected to a 28V DC bus (i.e. few millifarads capacitance value); inrush current limiting in AC motor windings at start-up (i.e. motor starts to rotate, as illustrated in FIG. 6, in this case the power is calculated or evaluated (i.e. LUT) to control the power dissipated in the solid-state AC switch (four quadrants switch) of the SSPC. This can also be used to protect diode-based rectifiers (6-pulse, 12-pulse or 18-pulse based); or inrush current limiting on the 115V AC bus due to capacitive load charging. Also, power systems making use of differential+/−270V DC and using dedicated SSPCs for each DC line may use this technique (possibly requiring communications between them for master/slave current limiting).

Compared to known techniques, the solution presented here is simpler since there is no need for a thermal model to be used in the control, only the correct power level to be dissipated is required. This method allows pre-charge time to be minimized while lifetime of the SSPC is not affected.

The invention claimed is:

1. A solid state power controller (SSPC) arranged to connect one or more sources to one or more loads, the SSPC comprising:
   one or more solid state switch; and
   control means configured to operate in an inrush current limiting mode wherein the control means limits the inrush current by operating the one or more solid state switches in a linear mode through control of its equivalent resistance and limits the power dissipated in the one or more switches based on a selected power dissipation threshold;
   wherein only a measured load current is used to limit the power dissipated in the SSPC and the control means limits the power dissipated in the SSPC based on the measured load current, estimated load voltage and maximum input voltage.

2. An SSPC as claimed in claim 1, wherein the control means are configured to disable the inrush current limiting mode during normal operation which allows the SSPC to be operated in its intended normal condition as a protection.

3. An SSPC according to claim 1, where the one or more solid state switches comprise one of: a Metal Oxide Semiconductor Field Effect Transistor (MOSFET); an Insulated Gate Bipolar Transistor (IGBT); a Bipolar Junction Transistor (BJT); and a Field Effect Transistor (FET), formed in Silicon, Silicon Carbide, or Gallium Nitride.

4. An SSPC according to claim 1, wherein the SSPC is an alternating current SSPC.

5. An SSPC according to claim 1, wherein the SSPC is a direct current SSPC.

6. An SSPC according to claim 1, wherein the control means are configured to limit the power dissipated in the SSPC with a closed loop regulator either through a current reference signal to an inner control loop of SSPC current or through a voltage adjustment of one or more solid state switches control terminals.

7. The SSPC according to claim 1, wherein the control means limits the power dissipated comprises memory storing a look-up table storing voltage drop values associated with current values or terminal control voltage of the switch for the selected threshold.

8. A power management system comprising:
   a power source; and
   an SSPC as claimed in claim 1,
   wherein the power source is, in use, connected to a load.

* * * * *